United States Patent
Holmes et al.

(10) Patent No.: US 10,270,402 B1
(45) Date of Patent: Apr. 23, 2019

(54) BROADBAND INPUT MATCHING AND VIDEO BANDWIDTH CIRCUITS FOR POWER AMPLIFIERS

(71) Applicant: NXP USA, Inc., Austin, TX (US)

(72) Inventors: Damon G. Holmes, Scottsdale, AZ (US); Jeffrey Kevin Jones, Chandler, AZ (US); Ning Zhu, Chandler, AZ (US); Jeffrey Spencer Roberts, Tempe, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/827,679

(22) Filed: Nov. 30, 2017

(51) Int. Cl.
| | | |
|---|---|---|
| *H03F 3/187* | (2006.01) |
| *H03F 1/56* | (2006.01) |
| *H03F 3/195* | (2006.01) |
| *H03F 3/213* | (2006.01) |
| *H01L 23/66* | (2006.01) |
| *H01L 23/498* | (2006.01) |

(52) U.S. Cl.
CPC ....... *H03F 1/565* (2013.01); *H01L 23/49838* (2013.01); *H01L 23/66* (2013.01); *H03F 3/195* (2013.01); *H03F 3/213* (2013.01); *H01L 2223/6655* (2013.01); *H03F 2200/222* (2013.01); *H03F 2200/225* (2013.01); *H03F 2200/387* (2013.01); *H03F 2200/451* (2013.01)

(58) Field of Classification Search
CPC ........... H03F 3/187; H03F 3/195; H03F 3/191
USPC .................................................. 330/307, 302
See application file for complete search history.

(56) References Cited

U.S. PATENT DOCUMENTS

| | | | | |
|---|---|---|---|---|
| 5,276,406 A | * | 1/1994 | Samay | H03F 3/1935 330/277 |
| 5,532,647 A | * | 7/1996 | Kawakami | H03G 1/0052 330/284 |
| 6,166,599 A | * | 12/2000 | Aparin | H03F 1/3241 330/149 |
| 7,511,575 B2 | * | 3/2009 | Gotou | H03F 3/211 330/124 R |
| 8,659,359 B2 | | 2/2014 | Ladhani et al. | |
| 8,970,308 B2 | | 3/2015 | Wilson et al. | |
| 9,106,187 B2 | | 8/2015 | Ladhani et al. | |
| 9,190,965 B2 | | 11/2015 | Ladhani et al. | |
| 9,571,044 B1 | | 2/2017 | Zhu et al. | |
| 9,979,360 B1 | | 5/2018 | McLaren et al. | |
| 2007/0120606 A1 | * | 5/2007 | Lee | H03F 1/0261 330/302 |
| 2014/0167863 A1 | * | 6/2014 | Ladhani | H03F 1/0288 330/302 |

* cited by examiner

*Primary Examiner* — Henry Choe

(57) ABSTRACT

A system may include a radio frequency (RF) amplifier device that includes an input impedance matching network and first and second baseband decoupling circuits, which may remove intermodulation distortion products from signal energy input to the RF amplifier device at baseband frequencies. The input impedance matching network may act as a band-pass or low-pass filter. A gate bias voltage may be applied to the gate of a transistor in the RF amplifier device through one of the baseband decoupling circuits or, alternatively, at an input node of the RF amplifier device.

18 Claims, 7 Drawing Sheets

US 10,270,402 B1

BROADBAND INPUT MATCHING AND VIDEO BANDWIDTH CIRCUITS FOR POWER AMPLIFIERS

TECHNICAL FIELD

Embodiments of the subject matter herein relate generally to packaged semiconductor devices, and more particularly to packaged, radio frequency (RF) semiconductor devices with impedance matching circuits that include baseband decoupling circuits to potentially enhance performance.

BACKGROUND

A typical high power, radio frequency (RF) semiconductor device may include one or more input leads, one or more output leads, one or more transistors, bond wires coupling the input lead(s) to the transistor(s), and bond wires coupling the transistor(s) to the output lead(s). The bond wires have inductive reactance at high frequencies, and such inductances are factored into the design of input and output impedance matching circuits for a device. In some cases, input and output impedance matching circuits may be contained within the same package that contains the device's transistor(s). More specifically, an in-package, input impedance matching circuit may be coupled between a device's input lead and a control terminal (e.g., the gate) of a transistor, and an in-package, output impedance matching circuit may be coupled between a current conducting terminal (e.g., the drain) of a transistor and a device's output lead.

In the field of amplifier design, it is often preferable to perform amplification of dual frequency modulated signals. Intermodulation distortion products are generated when these signals are processed by an RF power amplifier due to non-linear input capacitance of the RF power amplifier. These intermodulation distortion products may cause undesirable noise in the RF power amplifier system, and may occur primarily near the baseband frequency of the modulated signals. Due to their high change in input capacitance over voltage, gallium nitride (GaN) RF power amplifiers may experience higher magnitude intermodulation distortion products compared to other technologies such as laterally diffused metal oxide semiconductor (LDMOS) RF power amplifiers. Accordingly, in various amplification systems, and particularly RF power amplifiers, it may be preferable to reduce intermodulation distortion products.

DESCRIPTION OF THE DRAWINGS

A more complete understanding of the subject matter may be derived by referring to the detailed description and claims when considered in conjunction with the following figures:

DETAILED DESCRIPTION

The present disclosure relates to improved input impedance matching circuitry for radio frequency (RF) amplifiers. Intermodulation distortion (IMD) products are the result of the interaction of the amplitude modulation of two or more signals having different respective frequencies (e.g., a multi-tone amplitude modulated signal) with the nonlinearities of the amplifier system. The intermodulation between each frequency component of the modulated signals forms additional signals at frequencies that are different from harmonic frequencies of the modulated signals. These additional signals occur at the sum and difference frequencies of the frequencies of the modulated signals and at multiples of those sum and difference frequencies. These additional distortion components are referred to as IMD products and can be caused, in the present example, by non-linear behavior of the RF amplifier used to process the multi-tone amplitude modulated signal. These IMD products may introduce undesirable distortion in an RF amplifier system and, as a result, may indirectly reduce efficiency of the RF amplifier system since inefficient schemes would be needed to maintain the RF amplifier system linearity.

RF power amplifiers generally have an intrinsic non-linear input capacitance (e.g., between a gate terminal of an RF power amplifier and a source terminal of the RF power amplifier). This non-linear input capacitance may increase the magnitude of IMD products generated when an RF power amplifier receives and amplifies a multi-tone amplitude-modulated signal, which may, in turn, increase the amount of distortion observed at an output of the RF power amplifier and may thereby decrease the efficiency of the RF power amplifier when compensation techniques are used to improve linearity of the system.

Another contributor to the magnitude of IMD products can be tone spacing. Tone spacing herein refers to the frequency difference between two tones of a multi-tone AM signal. As this tone spacing increases, the magnitude of IMD products generated by the multi-tone AM signal passing through the amplifier also increases.

Video bandwidth (VBW) refers to a frequency range over which an amplifier shows symmetrical and constant IMD products. It should be noted that the linearity of these IMD products affects the complexity of signal filtering that needs to be performed on the multi-tone AM signal in order to remove the IMD products. For example, when the IMD products produced by the multi-tone signal passing through the amplifier are substantially constant with respect to tone spacing, the signal filtering needed to remove or reduce the IMD products is simple compared to the signal filtering needed to remove or reduce the substantially frequency variant IMD products.

Figure 1:
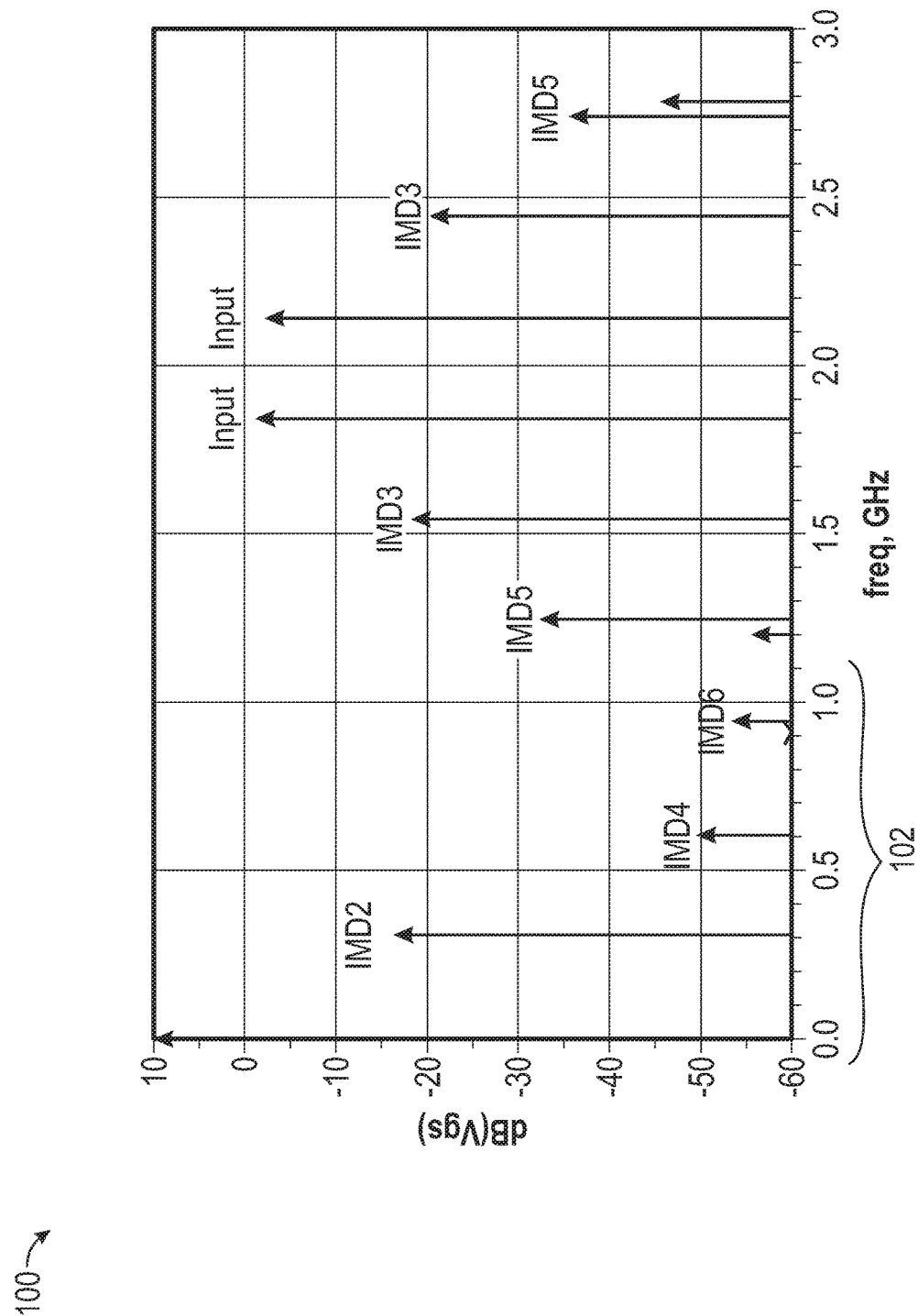
FIG. 1 is a graph illustrating intermodulation distortion products generated by a two-tone input signal at an input of an amplifier system.

An important component of the noise generated as a result of IMD products occurs near the baseband of the multi-tone amplitude modulated signal. FIG. 1 shows a graph 100 of voltage vs. frequency for a two-tone amplitude modulated (AM) signal across a gate terminal and a source terminal of an amplifier. The voltage (Vgs) is shown in decibels (e.g., on a logarithmic scale), while the frequency is shown in gigahertz (GHz). The two-tone AM signal includes a first input tone at 1.75 GHz and a second input tone at 2.25 GHz. The amplitude modulation of the first and second input tones generates several IMD products, IMD2, IMD3, IMD4, IMD5, and IMD6 each of which occur in frequency-symmetric pairs. IMD2 has a magnitude of roughly −15 dB and therefore is the greatest contributor to IMD generated noise of the baseband IMD products 102 shown in graph 100. As a result, it may be desirable to remove IMD2, IMD4 and IMD6 through baseband decoupling at the input of the amplifier.

Figure 2:
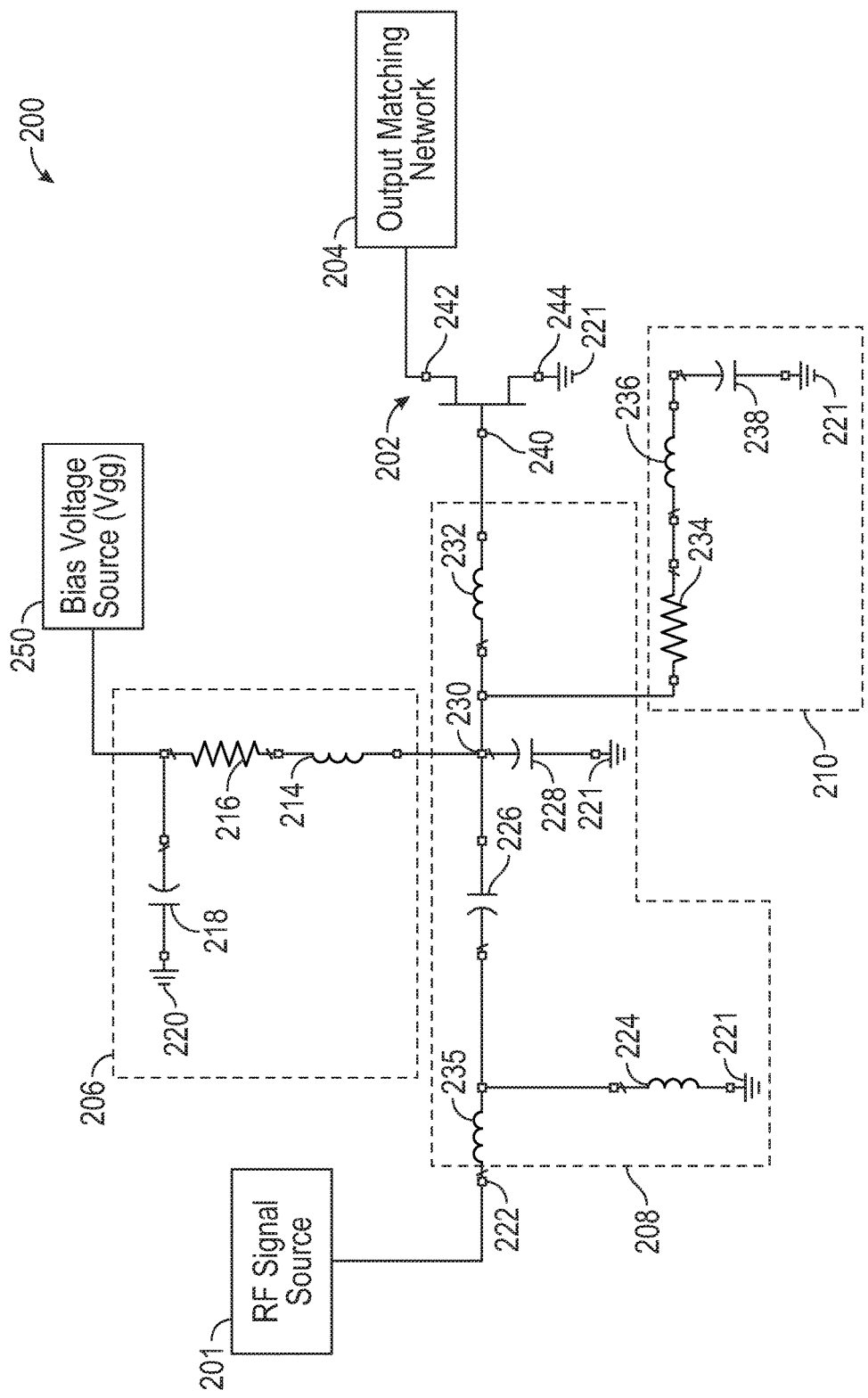
FIG. 2 is a block diagram of an illustrative amplifier path that includes an amplifier having an input network and an output network, in accordance with an embodiment.

FIG. 2 shows a block diagram of an amplifier system 200 that includes a transistor 202 having a gate terminal 240 (e.g., a control terminal), a source terminal 244, and a drain terminal 242. Source terminal 244 is connected to ground terminal 221 (e.g., ground reference node), which may be connected to a ground reference source, or which may be a ground plane of a package (e.g., package 400, FIG. 4) that houses amplifier system 200. Transistor 202 may be a High Electron Mobility Transistor (HEMT) formed on a substrate. This is merely illustrative and transistor 202 may be any desired type of transistor, including a bi-polar junction transistor (BJT), a laterally diffused metal oxide semiconductor (LDMOS) transistor, or another type of field effect transistor. Transistor 202 may also be formed on any desired, suitable semiconductor substrate, including, but not limited to, gallium arsenide (GaAs), silicon carbide (SiC), silicon (Si), silicon-on-insulator (SoI), sapphire, gallium nitride (GaN), GaN on silicon, GaN on SiC, and indium phosphide (InP) substrates, although other substrates also may be suitable. For instances in which transistor 202 is a BJT transistor, gate terminal 240 will be instead be a base terminal, source terminal 244 will instead be an emitter terminal, and drain terminal 242 will instead be a collector terminal.

Amplifier system 200 includes an output matching network 204 connected between the drain terminal 242 of transistor 202 and a load (not illustrated). Output matching network 204 may include a variety of capacitive, resistive, and inductive components designed to match an output impedance of transistor 202 to a predefined impedance of the load that is driven by the amplifier system 200. The load may be, for example, an antenna driven by amplifier system 200. This output impedance matching may reduce the amount of signal reflection that occurs when an output signal of transistor 202 passes from drain terminal 242 to the load through output matching network 204, compared to the amount of signal reflection that would occur with a mismatched impedance between drain terminal 242 and the load.

Amplifier system 200 also includes input circuitry coupled to gate terminal 240 of transistor 202, which includes an input matching network 208, an internal baseband decoupling circuit 210, and an external baseband decoupling circuit 206. Input matching network 208 may match an input impedance of transistor 202 to a predefined impedance of an RF signal source 201 that supplies an input signal (e.g., RF signal) to input node 222 of input matching network 208. RF signal source 201 may be, for example, external circuitry that produces one or more RF signals and is electrically coupled (e.g., connected to) the input node 222 of the input matching network 208. Input matching network 208 is coupled between gate terminal 240 of transistor 202 and an input node 222, which may be, for example, one or more RF input/output (I/O) leads. Input matching network 208 includes inductance 235 having a first terminal coupled to input node 222, and an L-section match that includes an inductance 224 coupled between a second terminal of inductance 235 and ground terminal 221, and further includes a capacitor 226 coupled between the second terminal of inductance 235 and a node 230, which may act as an RF cold point.

Input matching network 208 further includes a capacitor 228 coupled between node 230 and ground terminal 221, and an inductance 232 coupled between the node 230 and the gate terminal 240 of transistor 202. Internal baseband decoupling circuit 210 is coupled between the node 230 and ground terminal 221. According to an embodiment, inductance 235 has an inductance value in a range of about 50 picohenries (pH) to about 200 pH, inductance 224 has an inductance value in a range of about 100 pH to about 350 pH, inductance 235 has an inductance value in a range of about 50 pH to about 200 pH, capacitor 226 has a capacitance value in a range of about 30 picofarads (pF) to about 75 pF, capacitor 228 has a capacitance value in a range of about 100 pF to about 300 pF, and inductance 232 has an inductance value in a range of about 20 pH to about 150 pH, although these components may have values that are lower or higher than these ranges, as well. Inductance 232 and capacitor 228 may, together, act as a low-pass filter, allowing lower frequency signal energy to pass from node 230 to gate terminal 240, while directing higher frequency signal energy to ground terminal 221. Inductance 224 and capacitor 226 may, together, act as a high-pass filter, allowing higher frequency (e.g., RF) signal energy to pass from input node 222 to node 230, while directing lower frequency signal energy to ground terminal 221. Together, the high-pass filter of inductance 224 and capacitor 226 combined with the low-pass filter of inductance 232 and capacitor 228 may act as a band-pass filter, allowing only signal energy within a predetermined frequency range (e.g., 1.5 GHz to 2.5 GHz) to pass from input node 222 to gate terminal 240. In this way, input matching network 208 may be a band-pass input matching network, and node 230 may be an RF cold point node (e.g., a node that provides a low-impedance path to ground for RF signal energy within a predetermined frequency range of the frequency range of the band-pass filter of input matching network 208).

Internal baseband decoupling circuit 210 includes resistor 234, inductance 236, and capacitor 238 coupled in series between node 230 and ground terminal 221. According to an embodiment, inductance 236 has an inductance value in a range of about 70 pH to about 300 pH, resistor 234 has a resistance value in a range of about 0.1 ohms to about 1 ohm, and capacitor 238 has a capacitance value in a range of about 0.5 nanofarads (nF) to about 30 nF, although these components may have values that are lower or higher than these ranges, as well.

Figure 4:
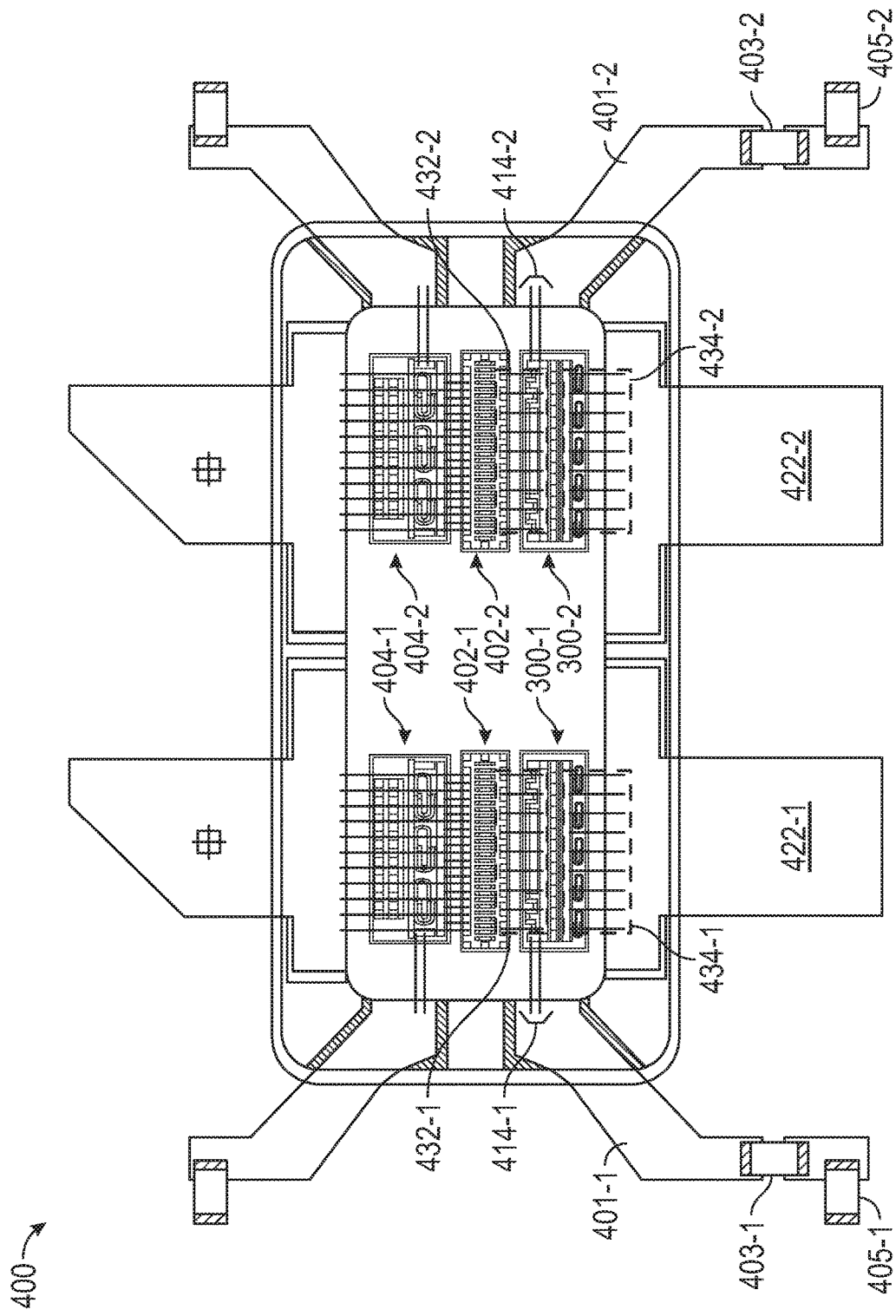
FIG. 4 is a top down view of an illustrative circuit package that includes two amplifier paths of the type shown in FIG. 2, in accordance with an embodiment.

External baseband decoupling circuitry 206 is coupled between node 230 and ground terminal 220 (e.g., ground reference node that is coupled to an external ground reference that may, for example, be external to a package containing amplifier system 200, such as package 400, FIG. 4), which may be separate from ground terminal 221 or may be electrically connected to ground terminal 221, depending on how the package containing input matching network 208, internal baseband decoupling circuit 210, transistor 202, and output matching network 204 is arranged. External baseband decoupling circuit 206 includes an inductance 214, a resistance 216, and a capacitor 218 coupled in series between node 230 and ground terminal 220. In some embodiments, resistance 216 (and resistances 516, 616, 716, described later) may be excluded. Ground terminal 220 may be an out-of-package (e.g., external) ground terminal that is different from ground terminal 221. Bias voltage source 250 may be coupled to a node between resistance 216 and capacitor 218, and may generate and provide a gate bias voltage Vgg for gate terminal 240. Alternatively, the bias voltage may be provided through an external gate bias circuit (e.g., external gate bias circuit 712, FIG. 7). According to an embodiment, inductance 214 has an inductance value in a range of about 200 pH to about 1000 pH, resistance 216 has a resistance value in a range of about 0.1 ohms to about 2 ohm, and capacitor 218 has a capacitance value in a range of about 1 microfarads (uF) to about 20 uF, although these components may have values that are lower or higher than these ranges, as well.

Baseband decoupling circuits 206 and 210 can be used to create low-impedance paths between node 230 and ground terminals 220 and 221, respectively, for baseband frequency signals that oscillate at baseband frequencies. Node 230 is an "RF cold point" in that, at RF frequencies, impedance at node 230 through internal baseband decoupling circuit 210 may be significantly greater (e.g., roughly 5 times greater) than the impedance at node 230 through capacitor 228. At node 230, external baseband decoupling circuit 206 may have an even greater impedance (e.g., roughly 30 times greater) than the impedance through capacitor 228 at RF frequencies. For example, at RF frequencies (e.g., frequencies greater than 1 GHz), as observed from node 230, capacitor 228 may exhibit an impedance between about 0.2 ohms and about 0.7 ohms, internal baseband decoupling circuit 210 may exhibit an impedance between about 1.2 ohms and about 5 ohms, and external baseband decoupling circuit 206 may exhibit an impedance between about 15 ohms and about 30 ohms. The capacitor 228 and circuits 210, 206 may exhibit lower or higher impedances than the above-given ranges, as well.

At low frequencies (e.g., baseband frequencies), current is directed to ground through baseband decoupling circuits 206 and 210, rather than through capacitor 228 or to gate 240 through inductance 232. External decoupling circuit 206 may provide the lowest impedance path to ground for signals having frequencies less than a first threshold (e.g., 30 megahertz (MHz)), while baseband decoupling circuit 210 may provide the lowest impedance path to ground for signals having frequencies between the first threshold (e.g., 30 MHz) and a second threshold (e.g., 1 GHz). For example, at baseband frequencies less than the first threshold, as observed from node 230, capacitor 228 may exhibit an impedance between about 20 ohms and about 1000 ohms, internal baseband decoupling circuit 210 may exhibit an impedance between about 1 ohm and about 6 ohms, and external baseband decoupling circuit 206 may exhibit an impedance between about 0.3 ohms and about 1 ohm. At baseband frequencies between the first threshold and the second threshold, as observed from node 230, capacitor 228 may exhibit an impedance between about 20 ohms and about 100 ohms, internal baseband decoupling circuit 210 may exhibit an impedance between about 0.5 ohms and about 1 ohm, and external baseband decoupling circuit 206 may exhibit an impedance between about 1 ohm and about 10 ohms. Once again, the capacitor 228 and circuits 210, 206 may exhibit lower or higher impedances than the above-given ranges, as well.

By directing signals at baseband frequencies to ground through baseband decoupling circuits 206 and 210, IMD products occurring at or near baseband frequencies may be removed from the input signal, which may increase the signal-to-noise ratio for amplifier system 200 compared to circuit configurations that lack these baseband decoupling circuits. By voltage biasing gate terminal 240 through inductance 214 and resistance 216 of external baseband decoupling circuit 206, it may not be necessary to include a quarter-wave bias line that is traditionally used for providing gate terminal voltage biasing, which may preserve circuit board space. By using a 2-section band-pass input matching network (e.g., input matching network 208) that includes band-pass filter implemented by a high-pass filter (e.g., inductance 224 and capacitor 226) and a low-pass filter (e.g., inductance 232 and capacitor 228) to create an RF cold point at node 230 to which input-side baseband terminating circuits (e.g., internal baseband decoupling circuit 210 and external baseband decoupling circuit 206) may be connected, decoupling of baseband frequency signal energy (e.g., including intermodulation distortion products) may be improved with negligible gain/VBW compromise.

Figure 3:
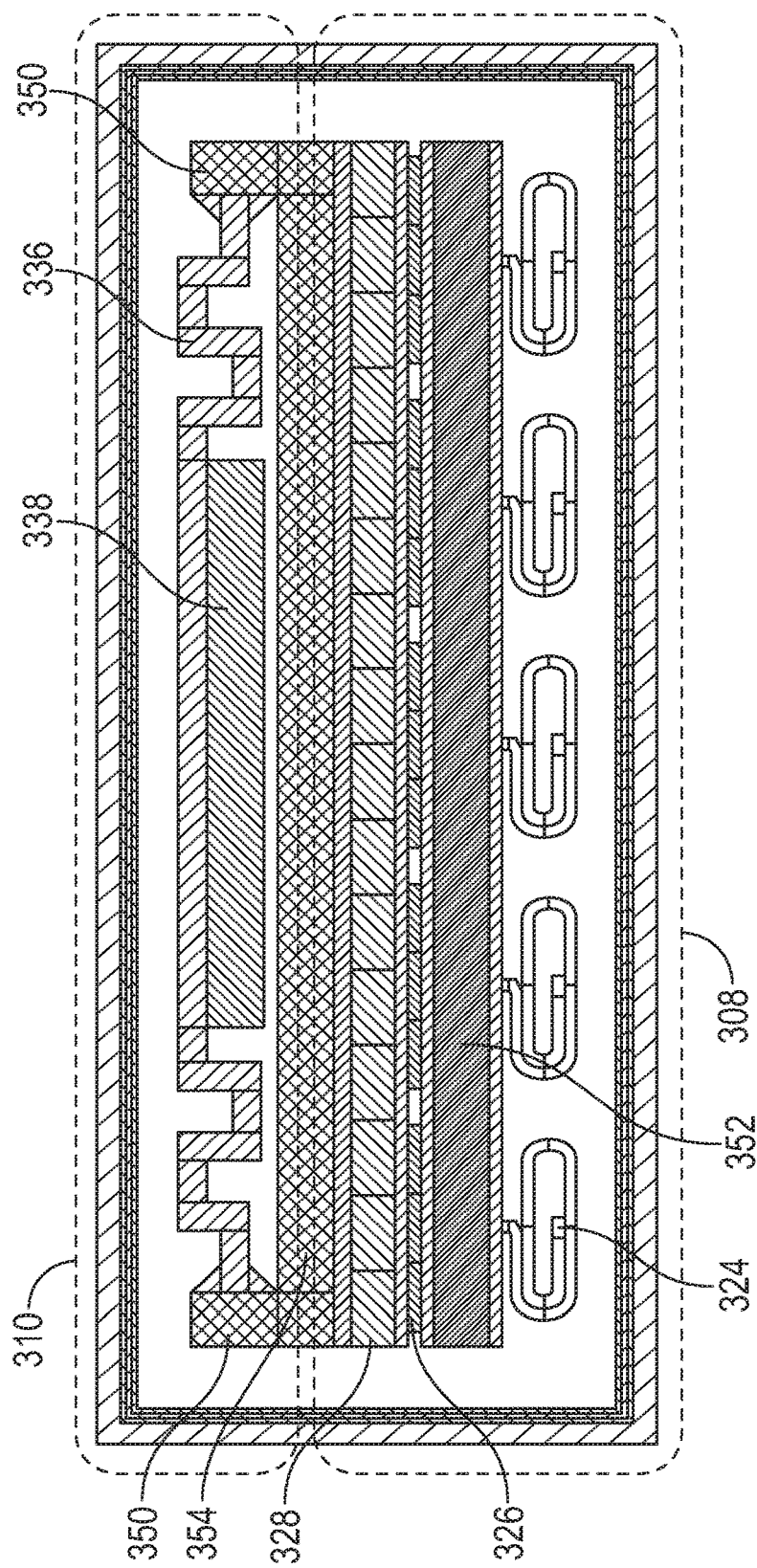
FIG. 3 is a top down view of an illustrative impedance input matching network and baseband decoupling circuit that may be used in the input network of the amplifier path of FIG. 2, in accordance with an embodiment.

FIG. 3 shows a top-down view of an illustrative circuit layout that may be used in implementing a portion of an amplifier system, such as amplifier system 200 of FIG. 2 or the amplifier paths in package 400 of FIG. 4. Circuit 300 (sometimes referred to herein as an input matching network, such as input matching network 300-1, 300-2, FIG. 4) may be an integrated circuit die having a semiconductor substrate formed from silicon (Si), silicon-on-insulator (SoI), silicon carbide (SiC), sapphire, gallium nitride (GaN), GaN on silicon, GaN on SiC, gallium arsenide (GaAs), indium phosphide (InP) or any other desired semiconductor material. Circuit 300 may be used to provide input impedance matching for the input of an amplifier (e.g., gate terminal of transistor 202). A stack-up of multiple metal and dielectric layers may be formed on the surface of the substrate of circuit 300 using, for example, photolithography, physical vapor deposition (PVD) techniques (e.g., thermal evaporation, electron-beam evaporation, sputtering, chemical vapor deposition (CVD), etc.), etching techniques (e.g., reactive ion etching, electron cyclotron resonance etching, inductively coupled plasma etching, etc.), or any appropriate combination of these. In alternate embodiments, circuit 300 may be implemented using alternating ceramic (or other insulator) and patterned metal layers. Either way, as circuit 300 includes primarily (or only) passive electrical components (e.g., capacitors, inductors, and resistors), in an embodiment, circuit 300 may more generically be referred to as an "integrated passive device" or "IPD."

The IPD containing circuit 300 may include a metallized backplane (not shown) on the bottom surface of the IPD, and that metallized backplane may be coupled to the body of a package (e.g., of package 400, FIG. 4), which may act as a ground terminal. Circuit 300 includes many components of RF matching circuitry 308 (e.g., input matching network 208, FIG. 2) and baseband termination circuitry 310 (e.g., internal baseband decoupling circuit 210, FIG. 2). Although the various components are depicted in the top-down view of FIG. 3 for illustration purposes, various ones of the components may be hidden below the top surface.

RF matching circuitry 308 may provide input impedance matching at RF frequencies for an amplifier (e.g., transistor 202, FIG. 2; amplifier 402-1, 402-2, FIG. 4) and may include a bond pad 352, inductors 324, capacitors 326, and a capacitor 328. Bond pad 352, which is exposed at the top surface of circuit 300, may act as an input node (e.g., input node 222, FIG. 2) for circuit 300. Bond wires (e.g., bond wires 434, FIG. 4) may couple bond pad 352 to a RF signal source (e.g., RF signal source 201, FIG. 2) that may supply RF signals to bond pad 352 (e.g., for amplification at transistor 202, FIG. 2; amplifier 402-1, 402-2, FIG. 4). Each of inductors 324 (e.g., inductance 224 FIG. 2) may be coupled between bond pad 352 and a ground terminal (e.g., a ground terminal or ground plane of package 400, FIG. 4; ground terminal 221, FIG. 2) (e.g., inductors 324 may be coupled to the metallized backplane using conductive vias). Inductors 324 may be coupled in parallel with one another to create an effective inductance (e.g., the inductance 224, FIG. 2) between bond pad 352 and the ground terminal. Capacitors 326 (e.g., capacitor 226, FIG. 2) may be coupled in parallel between bond pad 352 and a first terminal of capacitor 328 (e.g., such that input terminals of capacitors 326 are coupled to bond pad 352 and output terminals of capacitors 326 are coupled to the first terminal of capacitor 328) so as to create an effective capacitance (e.g., the capacitance represented by capacitor 226, FIG. 2) between bond pad 352 and the first terminal of capacitor 328. Capacitor 328 may have a second terminal coupled to the ground terminal (e.g., capacitor 328 may be coupled to the metallized backplane using conductive vias), and thereby may act as a shunt capacitor (e.g., capacitor 228, FIG. 2).

Baseband termination circuitry 310 (e.g., internal baseband decoupling circuit 210, FIG. 2) may provide low impedance paths to ground for signals at or near baseband frequencies when circuit 300 is implemented in a circuit package (e.g., package 400, FIG. 4). Baseband termination circuitry 310 includes bond pads 350, a bond pad 354, a capacitor 338, and inductors 336. Bond pad 354 (e.g., node 230, FIG. 2) acts as a connection between the first terminal of capacitor 328, bond pads 350, and an external transistor (e.g., transistor 202, FIG. 2, amplifier 402-1, 402-2, FIG. 4). For example, bond pad 354 may be coupled to the external transistor (e.g., to a gate terminal of the external transistor such as gate terminal 240 of transistor 202, FIG. 2) using bond wires (e.g., inductance 232, FIG. 2; bond wires 432, FIG. 4). Inductors 336 (e.g., inductance 236, FIG. 2) are coupled between bond pads 350 and capacitor 338 (e.g., capacitor 238, FIG. 2), and may be low-Q inductors (e.g., inductors with low quality factors, having a greater intrinsic resistance that contributes to resistance 234, FIG. 2, compared to high-Q inductors). Inductors 336 and capacitor 338 may have respective intrinsic resistances (e.g., which may cumulatively be represented as resistor 234, FIG. 2). Capacitor 338 may be a shielded high density capacitor, or any other suitable capacitor. In alternate embodiments, capacitor 338 may instead be disposed on a separate substrate or chip and may be coupled to bond pads 350 using bond wires, where the bond wires act as inductors, replacing inductors 336. Either way, capacitor 338 is coupled to a ground terminal (e.g., capacitor 338 may be coupled to the metallized backplane using conductive vias).

FIG. 4 shows a top-down view of an illustrative circuit package that may include an amplifier system, such as amplifier system 200 of FIG. 2, implemented with input matching and baseband termination circuitry, such as circuitry 300 of FIG. 3. Package 400 includes two amplifiers 402-1, 402-2 (e.g., which may be arranged to operate as a Doherty or inverted Doherty amplifier system), two output matching networks 404-1, 404-2, two input matching networks including circuits 300-1, 300-2 (e.g., each corresponding to circuit 300, FIG. 3) and bond wires 434-1, 434-2, 432-1, 432-2, additional bond wires 414-1, 414-2, gate supply leads 422-1, 422-2, leads 401-1, 401-2, optional resistors 403-1, 403-2, and capacitors 405-1, 405-2.

The amplifier paths that include amplifier 402-1 and 402-2 are now described, and it should be understood that the component arrangements described in connection with the amplifier path that includes amplifier 402-1 may also apply to the amplifier path that includes amplifier 402-2.

Amplifier 402-1 (e.g., which includes a transistor such as transistor 202, FIG. 2) is coupled to output matching network 404-1 (e.g., output matching network 204, FIG. 2), and further coupled to an input matching network (e.g., input matching network 208, FIG. 2) that includes bond wires 434-1 (e.g., inductance 235, FIG. 2), circuitry 300-1 (e.g., circuitry 300, FIG. 3), and bond wires 432-1 (e.g., inductance 232, FIG. 2). Gate supply lead 422-1 may provide a RF signal to the input matching network, which may in turn provide the RF signal to the gate terminal of amplifier 402-1.

As discussed previously, and according to an embodiment, the amplifier system includes both an internal baseband decoupling circuit (e.g., circuit 210, FIG. 2), and an external baseband decoupling circuit (e.g., circuit 206, FIG. 2). The input matching network, or more specifically circuitry 300-1 (e.g., one of bond pads 350 of circuit 300, FIG. 3), may be coupled to lead 401-1 through bond wires 414-1 (e.g., which may act as inductance 214, FIG. 2). Bond wires 414-1, which may carry bias voltage signals (e.g., gate bias voltage Vgg), may be arranged such that they are perpendicular to bond wires 432-1 and 434-1, which may primarily carry RF signals, in order to reduce coupling between bond wires carrying bias voltage signals and bond wires carrying RF signals (e.g., compared to arrangements in which these sets of bond wires are not arranged perpendicularly). Lead 401-1 may be a highly inductive bias lead that is connected to an external ground terminal (e.g., ground terminal 220, FIG. 2, which may be different from the ground plane of package 400) through an optional resistor 403-1 and a capacitor 405-1 (e.g., capacitor 218, FIG. 2). Voltage biasing for the gate/control terminal of amplifier 402-1 may be applied through lead 401-1, which may replace quarter-wave bias lines that are conventionally used to provide such voltage biasing. For example, a DC bias voltage source (e.g., bias voltage source 250, FIG. 2) may be coupled to the bond pad between resistor 403-1 and capacitor 405-1 in order to provide a gate bias voltage, Vgg. Capacitor 405-1 and optional resistor 403-1 may be discrete components, such as surface mount components. Bond wires 414-1, lead 401-1, and (optionally) resistor 403-1 may have a cumulative series resistance (e.g., which contribute to resistance 216, FIG. 2).

Amplifier 402-2 (e.g., which includes a transistor such as transistor 202, FIG. 2) is coupled to output matching network 404-2 (e.g., output matching network 204, FIG. 2), and further coupled to input matching network 300-2 (e.g., circuitry 300, FIG. 3; input matching network 208, FIG. 2) through bond wires 432-2 (e.g., inductance 232, FIG. 2). Input matching network 300-2 is coupled to gate supply lead 422-2 through bond wires 434-2. Gate supply lead 422-2 may provide a RF signal to input matching network 300-2, which may in turn provide the RF signal to the gate terminal of amplifier 402-2. Another instance of input matching network, or more specifically circuitry 300-2 (e.g., one of bond pads 350 of circuit 300, FIG. 3), may be coupled to lead 401-2 through bond wires 414-2 (e.g., which may act as inductance 214, FIG. 2). Bond wires 414-2, which may primarily carry bias voltage signals, may be arranged such that they are perpendicular to bond wires 432-2 and 434-2, which may primarily carry RF signals, in order to reduce coupling between bond wires carrying bias voltage signals and bond wires carrying RF signals (e.g., compared to arrangements in which these sets of bond wires are not arranged perpendicularly). Lead 401-2 may be a highly inductive bias lead that is connected to an external ground terminal (e.g., ground terminal 220, FIG. 2, which may be different from the ground plane of package 400) through an optional resistor 403-2 and a capacitor 405-2 (e.g., capacitor 218, FIG. 2). Voltage biasing for the gate/control terminal of amplifier 402-2 may be applied through lead 401-2, which may replace quarter-wave bias lines that are conventionally used to provide such voltage biasing. For example, a DC bias voltage source (e.g., bias voltage source 250, FIG. 2) may be coupled to the bond pad between resistor 403-2 and capacitor 405-2 in order to provide a gate bias voltage, Vgg. Capacitor 405-2 and optional resistor 403-2 may be discrete components, such as surface mount components. Bond wires 414-2, lead 401-2, and (optionally) resistor 403-2 may have a cumulative series resistance (e.g., which contribute to resistance 216, FIG. 2).

Figure 5:
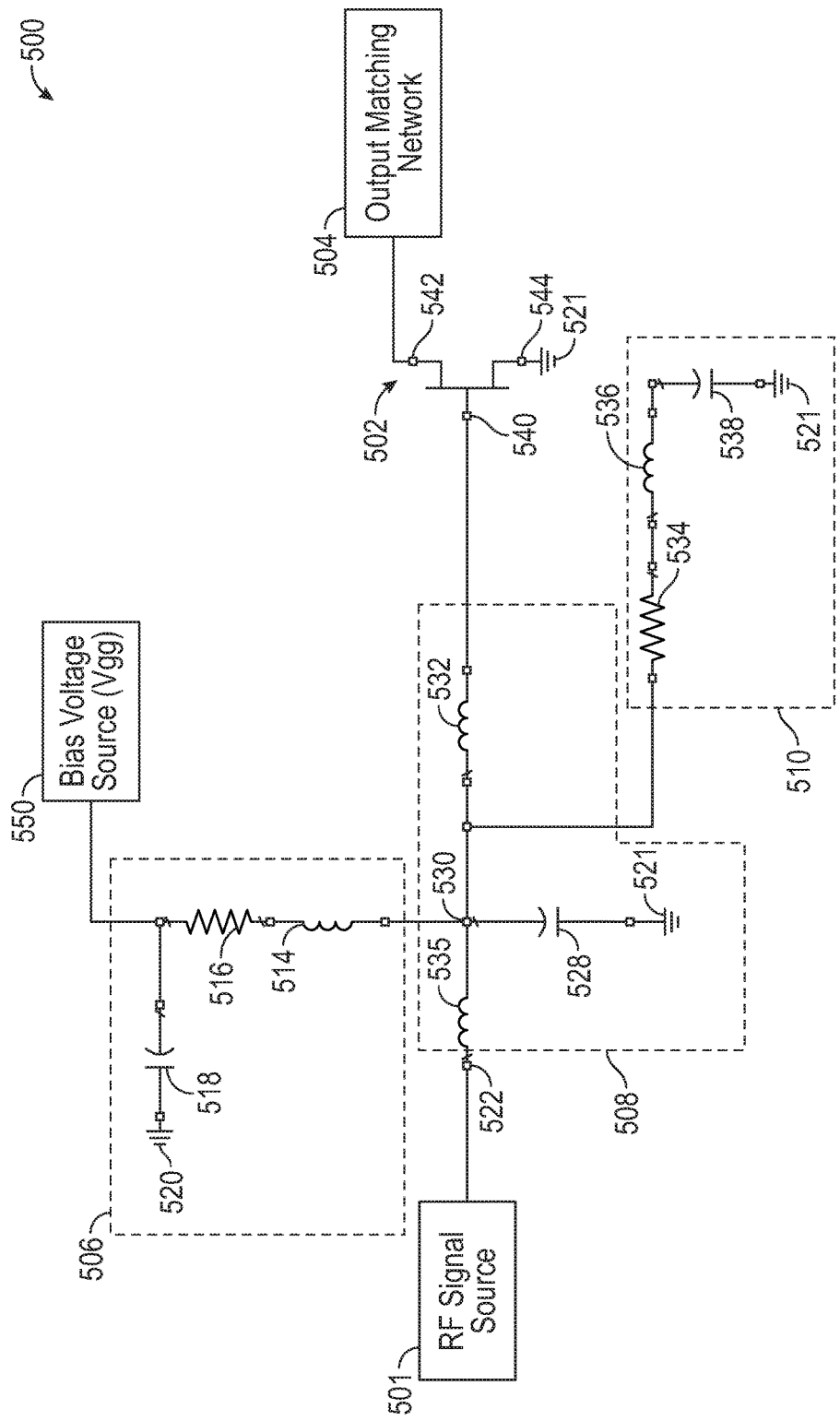
FIG. 5 is a block diagram of an illustrative amplifier path without an input L-section match, in accordance with an embodiment.

FIG. 5 shows a circuit diagram of an illustrative amplifier system 500, which may be used, for example, as an alternative to the amplifier system 200 of FIG. 2. Amplifier system 500 includes a transistor 502 having a gate terminal 540, a source terminal 544, and a drain terminal 542. Source terminal 544 is connected to ground terminal 521, which may be connected to a ground reference source, or which may be a ground plane of a package (e.g., package 400, FIG. 4) that houses amplifier system 500. Transistor 502 may be a HEMT transistor formed on a substrate. This is merely illustrative and transistor 502 may be any desired type of transistor, including a BJT or a LDMOS transistor, or another type of field effect transistor. Transistor 502 may also be formed on any desired, suitable semiconductor substrate, including, but not limited to, GaAs, SiC, Si, SoI, sapphire, GaN, GaN on silicon, substrates. For instances in which transistor 502 is a BJT transistor, gate terminal 540 will be instead be a base terminal, source terminal 544 will instead be an emitter terminal, and drain terminal 542 will instead be a collector terminal.

Amplifier system 500 includes an output matching network 504 connected to drain terminal 542 of transistor 502. Output matching network 504 may include a variety of capacitive, resistive, and inductive components designed to match an output impedance of transistor 502 to a predefined impedance of a load that is driven by the amplifier system 500. The load may be, for example, an antenna driven by amplifier system 500. This output impedance matching may reduce the amount of signal reflection that occurs when an output signal of transistor 502 passes from drain terminal 542 to the load through output matching network 504, compared to the amount of signal reflection that would occur with a mismatched impedance between drain terminal 542 and the load.

Amplifier system 500 also includes input circuitry coupled to gate terminal 540 of transistor 502, which includes an input matching network 508, an internal baseband decoupling circuit 510, and an external baseband decoupling circuit 506. Input matching network 508 may match an input impedance of transistor 502 to a predefined impedance of an RF signal source 501 that supplies an input signal (e.g., a RF signal) to input node 522 of input matching network 508. RF signal source 501 may be, for example, external circuitry that produces one or more RF signals and that is electrically coupled (e.g., connected to) the input node 522 of the input matching network 508. Input matching network 508 is coupled between gate terminal 540 of transistor 502 and an input node 522, which may be, for example, one or more RF input/output (I/O) leads.

Input matching network 508 includes an inductance 535 coupled between input node 522 and node 530, a capacitor 528 coupled between node 530 and ground terminal 521, and an inductance 532 coupled between node 530 and gate terminal 540 of transistor 502. Bias voltage source 550 may be coupled to a node between resistance 516 and capacitor 518, and may generate and provide a gate bias voltage Vgg for gate terminal 540. Alternatively, the bias voltage may be provided through an external gate bias circuit (e.g., external gate bias circuit 712, FIG. 7). According to an embodiment, inductance 535 has an inductance value in a range of about 50 pH to about 200 pH, capacitor 528 has a capacitance value in a range of about 100 pF to about 300 pF, and inductance 532 has an inductance value in a range of about 20 pH to about 150 pH, although these components may have values that are lower or higher than these ranges, as well. Inductance 532 and capacitor 528 may, together, act as a low-pass filter, allowing lower frequency signal energy to pass from node 530 to gate terminal 540, while directing higher frequency signal energy to ground terminal 521. In this way, input matching network 508 may be a low-pass input matching network, and node 530 may be an RF cold point node (e.g., a node that provides a low-impedance path to ground for RF signal energy within a predetermined frequency range above of the frequency range of the low-pass filter of input matching network 508).

Internal baseband decoupling circuit 510 is coupled between the node 530 and ground terminal 521. Internal baseband decoupling circuit 510 includes resistor 534, inductance 536, and capacitor 538 coupled in series between node 530 and ground terminal 521. External baseband decoupling circuitry 506 is coupled between node 530 and ground terminal 520, which may be separate from ground terminal 521 or may be electrically connected to ground terminal 521, depending on how the package containing input matching network 508, internal baseband decoupling circuit 510, transistor 502, and output matching network 504 is arranged. External baseband decoupling circuit 506 includes a resistor 516, an inductance 514, and a capacitor 518 coupled in series between node 530 and ground terminal 520. Ground terminal 520 may be an out-of-package (e.g., external) ground terminal that is different from ground terminal 521. Baseband decoupling circuits 506 and 510 may operate similarly to baseband decoupling circuits 206 and 210 described above in connection with FIG. 2.

Input matching network 508 excludes the L-section match of inductance 224 and capacitor 226 of FIG. 2, and instead input node 522 is coupled to node 530 directly through inductance 535. This arrangement may reduce the circuit footprint of amplifier system 500, although the removal of the L-section match may reduce the quality of the impedance match provided by input matching network 508, compared to that of input matching network 208 of FIG. 2.

Figure 6:
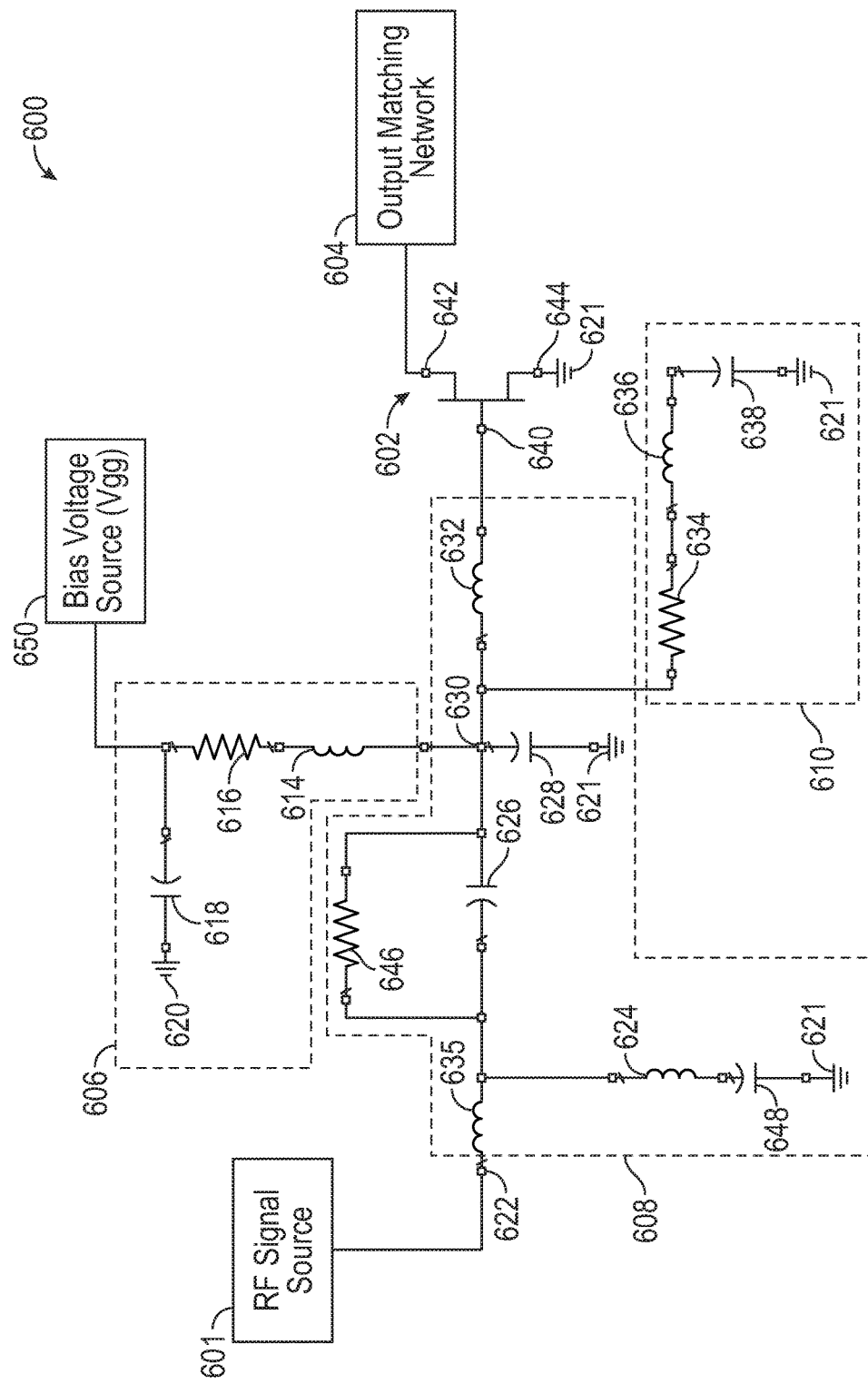
FIG. 6 is a block diagram of an illustrative amplifier path that includes a bypass resistor across a capacitor of an input L-section match, in accordance with another embodiment.

FIG. 6 shows a circuit diagram of an illustrative amplifier system 600, which may be used, for example, as an alternative to the amplifier systems 200 and 500 of FIGS. 2 and 5. Amplifier system 600 includes a transistor 602 having a gate terminal 640, a source terminal 644, and a drain terminal 642. Source terminal 644 is connected to ground terminal 621, which may be connected to a ground reference source, or which may be a ground plane of a package (e.g., package 400, FIG. 4) that houses amplifier system 600. Transistor 602 may be a HEMT transistor formed on a substrate. This is merely illustrative and transistor 602 may be any desired type of transistor, including a BJT or a LDMOS transistor. Transistor 602 may also be formed on any desired, suitable semiconductor substrate, including, but not limited to GaAs, SiC, Si, SoI, sapphire, GaN, GaN on silicon, GaN on SiC, and InP substrates. For instances in which transistor 602 is a BJT transistor, gate terminal 640 will be instead be a base terminal, source terminal 644 will instead be an emitter terminal, and drain terminal 642 will instead be a collector terminal.

Amplifier system 600 includes an output matching network 604 connected to drain terminal 642 of transistor 602. Output matching network 604 may include a variety of capacitive, resistive, and inductive components designed to match an output impedance of transistor 602 to a predefined impedance of a load that is driven by the amplifier system 600. The load may be, for example, an antenna driven by amplifier system 600. This output impedance matching may reduce the amount of signal reflection that occurs when an output signal of transistor 602 passes from drain terminal 642 to the load through output matching network 604, compared to the amount of signal reflection that would occur with a mismatched impedance between drain terminal 642 and the load.

Amplifier system 600 also includes input circuitry coupled to gate terminal 640 of transistor 602, which includes an input matching network 608, an internal baseband decoupling circuit 610, and an external baseband decoupling circuit 606. Input matching network 608 may match an input impedance of transistor 602 to a predefined impedance of a RF signal source 601 that supplies an input signal (e.g., a RF signal) to input node 622 of input matching network 608. RF signal source 601 may be, for example, external circuitry that produces one or more RF signals and that is electrically coupled (e.g., connected to) the input node 622 of the input matching network 608. Input matching network 608 is coupled between gate terminal 640 of transistor 602 and an input node 622, which may be, for example, one or more RF input/output (I/O) leads. Input matching network 608 includes an inductance 635 having a first terminal coupled to input node 622, an L-section match that includes an inductance 624 and capacitor 648 that are coupled together in series between ground terminal 621 and a second terminal of inductance 635, and that further includes a capacitor 626 that is coupled between the second terminal of inductance 635 and node 630. A bypass resistor 646 is coupled in parallel with capacitor 626 between the second terminal of inductance 635 and node 630.

Input matching network 608 further includes a capacitor 628 coupled between node 630 and ground terminal 621, and an inductance 632 coupled between the node 630 and the gate terminal 640 of transistor 602. Bias voltage source 650 may be coupled to a node between resistance 616 and capacitor 618, and may generate and provide a gate bias voltage Vgg for gate terminal 640. Alternatively, the bias voltage may be provided through an external gate bias circuit (e.g., external gate bias circuit 712, FIG. 7). According to an embodiment, inductance 635 has an inductance value in a range of about 50 pH to about 200 pH, inductance 624 has an inductance value in a range of about 100 pH to about 350 pH, capacitor 648 has a capacitance value in a range of about 100 pF to about 200 pF, capacitor 626 has a capacitance value in a range of about 30 pF to about 75 pF, resistor 646 has a resistance value in a range of about 50 ohms to about 200 ohms, capacitor 628 has a capacitance value in a range of about 100 pF to about 300 pF, and inductance 632 has an inductance value in a range of about 20 pH to about 150 pH, although these components may have values that are lower or higher than these ranges, as well. Inductance 632 and capacitor 628 may, together, act as a low-pass filter, allowing lower frequency signal energy to pass from node 630 to gate terminal 640, while directing higher frequency signal energy to ground terminal 621. Inductance 624, capacitor 626, and capacitor 648 may, together, act as a high-pass filter, allowing higher frequency (e.g., RF) signal energy to pass from input node 622 to node 630, while directing lower frequency signal energy to ground terminal 621. Together, the high-pass filter of inductance 624 and capacitor 626 combined with the low-pass filter of inductance 632 and capacitor 628 may act as a band-pass filter, allowing only signal energy within a predetermined frequency range (e.g., 1.5 GHz to 2.5 GHz) to pass from input node 622 to gate terminal 640. In this way, input matching network 608 may be a band-pass input matching network, and node 630 may be an RF cold point node (e.g., a node that provides a low-impedance path to ground for RF signal energy within a predetermined frequency range above of the frequency range of the band-pass filter of input matching network 608).

Internal baseband decoupling circuit 610 is coupled between the node 630 and ground terminal 621. Internal baseband decoupling circuit 610 includes resistor 634, inductance 636, and capacitor 638 coupled in series between node 630 and ground terminal 621. External baseband decoupling circuitry 606 is coupled between node 630 and ground terminal 620, which may be separate from ground terminal 621 or may be electrically connected to ground terminal 621, depending on how the package containing input matching network 608, internal baseband decoupling circuit 610, transistor 602, and output matching network 604 is arranged. External baseband decoupling circuit 606 includes a resistor 616, an inductance 614, and a capacitor 618 coupled in series between node 630 and ground terminal 620. Ground terminal 620 may be an out-of-package (e.g., external) ground terminal that is different from ground terminal 621. Baseband decoupling circuits 606 and 610 may operate similarly to baseband decoupling circuits 206 and 210 described above in connection with FIG. 2.

Amplifier system 600 differs from amplifier system 200 of FIG. 2 through the inclusion of bypass resistor 646 and capacitor 648. Through the addition of bypass resistor 646 in parallel with capacitor 626, flexibility for direct current (DC) biasing may be improved. For example, a gate bias voltage may be applied through input node 622 (e.g., through an input lead, such as lead 422-1, 422-2, FIG. 4) to gate terminal 640 due to the presence of bypass resistor 646. Capacitor 648 may be included in order to prevent short circuiting to ground terminal 621 through inductance 624 when a gate bias voltage is applied at input node 622, and thereby may act as a DC blocking capacitor.

Figure 7:
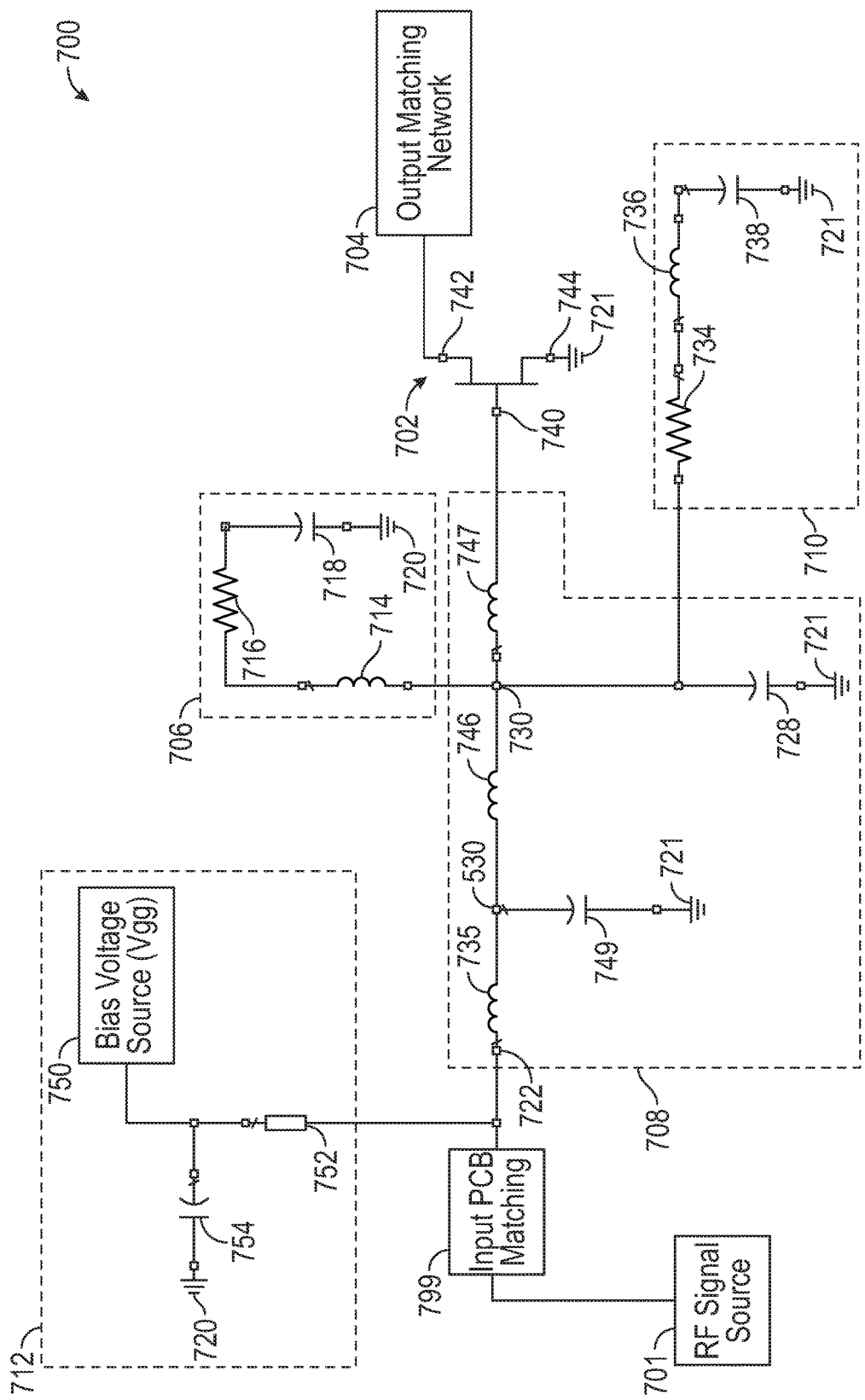
FIG. 7 is a block diagram of an illustrative amplifier path that includes a two-section low-pass match, in accordance with another embodiment.

FIG. 7 is a block diagram of an illustrative amplifier system 700 that includes a two-section low-pass matching network, in accordance with another embodiment. Amplifier system 700 includes a transistor 702 having a gate terminal 740 (e.g., a control terminal), a source terminal 744, and a drain terminal 742. Source terminal 744 is connected to ground terminal 721 (e.g., ground reference node), which may be connected to a ground reference source, or which may be a ground plane of a package (e.g., package 400, FIG. 4) that houses amplifier system 700. Transistor 702 may be a HEMT formed on a substrate. This is merely illustrative and transistor 702 may be any desired type of transistor, including a BJT, an LDMOS transistor, or another type of field effect transistor. Transistor 702 may also be formed on any desired, suitable semiconductor substrate, including, but not limited to, GaAs, SiC, Si, SoI, sapphire, GaN, GaN on silicon, GaN on SiC, and InP substrates, although other substrates also may be suitable. For instances in which transistor 702 is a BJT transistor, gate terminal 740 will be instead be a base terminal, source terminal 744 will instead be an emitter terminal, and drain terminal 742 will instead be a collector terminal.

Similar to previously described embodiments, amplifier system 700 includes an output matching network 704 connected between the drain terminal 742 of transistor 702 and a load (not illustrated). Output matching network 704 may include a variety of capacitive, resistive, and inductive components designed to match an output impedance of transistor 702 to a predefined impedance of the load that is driven by the amplifier system 700.

Amplifier system 700 also includes input circuitry coupled to gate terminal 740 of transistor 702, which includes an input matching network 708, an internal baseband decoupling circuit 710, and an external baseband decoupling circuit 706. Input matching network 708 may match an input impedance of transistor 702 to a predefined impedance of an RF signal source 701 that supplies an input signal (e.g., RF signal) to an input node 722 of input matching network 708. RF signal source 701 may be, for example, external circuitry that produces one or more RF signals and is electrically coupled (e.g., connected to) the input node 722 of the input matching network 708 through an input PCB matching network 799. Input matching network 708 is coupled between gate terminal 740 of transistor 702 and the input node 722, which may be, for example, one or more RF I/O leads. Input matching network 708 includes inductance 735 having a first terminal coupled to input node 722, and an L-section match that includes a capacitance 749 coupled between a second terminal of inductance 735 and ground terminal 721, and further includes an inductance 746 coupled between the second terminal of inductance 735 and a node 730, which may act as an RF cold point.

Input matching network 708 further includes a capacitor 728 coupled between node 730 and ground terminal 721, and an inductance 747 coupled between the node 730 and the gate terminal 740 of transistor 702. Internal baseband decoupling circuit 710 is coupled between the node 730 and ground terminal 721. According to an embodiment, inductance 735 has an inductance value in a range of about 50 pH to about 400 pH, capacitor 749 has a capacitance value in a range of about 5 pF to about 50 pF, inductance 746 has an inductance value in a range of about 50 pH to about 400 pH, capacitor 728 has a capacitance value in a range of about 100 pF to about 300 pF, and inductance 747 has an inductance value in a range of about 50 pH to about 400 pH, although these components may have values that are lower or higher than these ranges, as well. Inductances 746, 747 and capacitors 728, 749 may, together, act as a two-section low-pass filter, allowing lower frequency signal energy to pass from node 730 to gate terminal 740, while directing higher frequency signal energy to ground terminal 721. The two-section low-pass filter made up of inductances 746, 747 and capacitors 728, 749 allow only signal energy within a predetermined frequency range (e.g., less than 2.4 GHz) to pass from input node 722 to gate terminal 740. In this way, input matching network 708 may be a low-pass input matching network, and node 730 may be an RF cold point node (e.g., a node that provides a low-impedance path to ground for RF signal energy within a predetermined frequency range below the frequency range of the low-pass filter of input matching network 708).

Internal baseband decoupling circuit 710 includes resistor 734, inductance 736, and capacitor 738 coupled in series between node 730 and ground terminal 721. According to an embodiment, inductance 736 has an inductance value in a range of about 70 pH to about 300 pH, resistor 734 has a resistance value in a range of about 0.1 ohms to about 1 ohm, and capacitor 738 has a capacitance value in a range of about 0.5 nF to about 30 nF, although these components may have values that are lower or higher than these ranges, as well.

External baseband decoupling circuitry 706 is coupled between node 730 and ground terminal 720 (e.g., ground reference node that is coupled to an external ground reference that may, for example, be external to a package containing amplifier system 700, such as package 400, FIG. 4), which may be separate from ground terminal 721 or may be electrically connected to ground terminal 721, depending on how the package containing input matching network 708, internal baseband decoupling circuit 710, transistor 702, and output matching network 704 is arranged. External baseband decoupling circuit 706 includes an inductance 714, a resistance 716, and a capacitor 718 coupled in series between node 730 and ground terminal 720. Ground terminal 720 may be an out-of-package (e.g., external) ground terminal that is different from ground terminal 721. According to an embodiment, inductance 714 has an inductance value in a range of about 200 pH to about 1000 pH, resistance 716 has a resistance value in a range of about 0.1 ohms to about 2 ohm, and capacitor 718 has a capacitance value in a range of about 1 microfarads (uF) to about 20 uF, although these components may have values that are lower or higher than these ranges, as well.

Baseband decoupling circuits 706 and 710 can be used to create low-impedance paths between node 730 and ground terminals 720 and 721, respectively, for baseband frequency signals that oscillate at baseband frequencies. Similar to previously described embodiments, node 730 is an "RF cold point" in that, at RF frequencies, impedance at node 730 through internal baseband decoupling circuit 710 may be significantly greater (e.g., roughly 5 times greater) than the impedance at node 730 through capacitor 728. At node 730, external baseband decoupling circuit 706 may have an even greater impedance (e.g., roughly 30 times greater) than the impedance through capacitor 728 at RF frequencies. For example, at RF frequencies (e.g., frequencies greater than 1 GHz), as observed from node 730, capacitor 728 may exhibit an impedance between about 0.2 ohms and about 0.7 ohms, internal baseband decoupling circuit 710 may exhibit an impedance between about 1.2 ohms and about 5 ohms, and external baseband decoupling circuit 706 may exhibit an impedance between about 15 ohms and about 30 ohms. The capacitor 728 and circuits 710, 706 may exhibit lower or higher impedances than the above-given ranges, as well.

At low frequencies (e.g., baseband frequencies), current is directed to ground through baseband decoupling circuits 706 and 710, rather than through capacitor 728 or to gate 740 through inductance 747. External decoupling circuit 706 may provide the lowest impedance path to ground for signals having frequencies less than a first threshold (e.g., 30 megahertz (MHz)), while baseband decoupling circuit 710 may provide the lowest impedance path to ground for signals having frequencies between the first threshold (e.g., 30 MHz) and a second threshold (e.g., 1 GHz). For example, at baseband frequencies less than the first threshold, as observed from node 730, capacitor 728 may exhibit an impedance between about 20 ohms and about 1000 ohms, internal baseband decoupling circuit 710 may exhibit an impedance between about 1 ohm and about 6 ohms, and external baseband decoupling circuit 706 may exhibit an impedance between about 0.3 ohms and about 1 ohm. At baseband frequencies between the first threshold and the second threshold, as observed from node 730, capacitor 728 may exhibit an impedance between about 20 ohms and about 100 ohms, internal baseband decoupling circuit 710 may exhibit an impedance between about 0.5 ohms and about 1 ohm, and external baseband decoupling circuit 706 may exhibit an impedance between about 1 ohm and about 10 ohms. Once again, the capacitor 728 and circuits 710, 706 may exhibit lower or higher impedances than the above-given ranges, as well.

By directing signals at baseband frequencies to ground through baseband decoupling circuits 706 and 710, IMD products occurring at or near baseband frequencies may be removed from the input signal, which may increase the signal-to-noise ratio for amplifier system 700 compared to circuit configurations that lack these baseband decoupling circuits. By using a low-pass input matching network (e.g., input matching network 708) that includes a two-section low-pass filter (e.g., inductances 746, 747 and capacitors 728, 749) to create an RF cold point at node 730 to which input-side baseband terminating circuits (e.g., internal baseband decoupling circuit 710 and external baseband decoupling circuit 706) may be connected, decoupling of baseband frequency signal energy (e.g., including intermodulation distortion products) may be improved with negligible gain/VBW compromise.

It should be noted that another difference between the system 700 and previously-described embodiments is that system 700 includes an external gate bias circuit 712 that includes a quarter wave transmission line 752, a capacitor 754, and bias voltage source 750 coupled to input node 722 and ground reference 720 (e.g., ground reference node that is coupled to an external ground reference). In some embodiments, capacitor 754 and quarter wave transmission line 752 may be coupled in series between input node 722 and ground reference 720. At a node between the transmission line 752 and capacitor 754, the bias voltage source 750 may generate and provide a gate bias voltage Vgg for gate terminal 740. In an alternate embodiment, the gate bias voltage may be provided at a node between inductance 714 and capacitor 718 of external baseband decoupling circuit 706, as previously described.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

In accordance with an embodiment, a device may include an amplifier, an input terminal, a first ground terminal, an impedance matching network, and a first baseband decoupling circuit. The amplifier may include a control terminal. The impedance matching network may be electrically connected between the control terminal of the amplifier and the input terminal. The impedance matching network may include a radio frequency (RF) cold point node that provides a low impedance path to the first ground terminal for signals within a predetermined frequency range. The first baseband decoupling circuit may be electrically connected between the RF cold point node and the first ground terminal.

In accordance with another aspect of the embodiment, the device may include a second baseband decoupling circuit that is coupled in parallel with the first baseband decoupling circuit. The second baseband decoupling circuit may be electrically connected to the RF cold point node.

In accordance with another aspect of the embodiment, the first baseband decoupling circuit may include a first resistance, a first inductor, and a first capacitor that are electrically connected in series between the RF cold point node and the first ground terminal. The first baseband decoupling circuit may be a low impedance path to the first ground terminal for baseband frequency signals that oscillate at baseband frequencies.

In accordance with another aspect of the embodiment, the second baseband decoupling circuit may include a second resistance, a second inductor, and a second capacitor that are electrically connected in series between the RF cold point node and a second ground terminal.

In accordance with another aspect of the embodiment, the impedance matching network may include a first capacitor electrically connected between the RF cold point node and the first ground terminal, and a first inductance electrically connected between the RF cold point node and the control terminal of the amplifier.

In accordance with another aspect of the embodiment, the impedance matching network may include a second inductance electrically connected between the first ground terminal and the input terminal, and a second capacitor electrically connected between the input terminal and the RF cold point node.

In accordance with another aspect of the embodiment, the impedance matching network may include a bypass resistor electrically connected in parallel with the second capacitor between the input terminal and the RF cold point node, and a third capacitor electrically connected between the second inductance and the first ground terminal.

In accordance with another aspect of the embodiment, the amplifier may include a high electron mobility transistor formed on a semiconductor substrate.

In accordance with an embodiment, a system may include a packaged electronic device and that includes a transistor, an RF input terminal, a first ground reference node, and an impedance matching network. The transistor may have a control terminal. The impedance matching network may be electrically connected between the control terminal of the transistor and the RF input terminal. The impedance matching network may include a radio frequency (RF) cold point node that presents a low impedance path to the first ground reference node for signals within a predetermined frequency range. The system may further include a second baseband decoupling circuit having a portion that is external to the packaged electronic device and that is connected between the RF cold point node and a second ground reference node.

In accordance with another aspect of the embodiment, the first baseband decoupling circuit may include a first resistance, a first inductance, and a first capacitor that are electrically connected in series between the RF cold point node and the first ground reference node.

In accordance with another aspect of the embodiment, the second baseband decoupling circuit may include a second resistance, a second inductance, and a second capacitor, that are electrically connected in series between the RF cold point node and the second ground reference node.

In accordance with another aspect of the embodiment, the second inductance may include a plurality of bond wires and a package lead. The second resistance may include a surface mount resistor. The second capacitor may include a surface mount capacitor.

In accordance with another aspect of the embodiment, the impedance matching network may include a first capacitor electrically connected between the RF cold point node and the first ground reference node, and a first inductance electrically connected between the RF cold point node and the control terminal of the transistor.

In accordance with another aspect of the embodiment, the impedance matching network may include a second inductance electrically connected between the first ground reference node and the RF input terminal, and a second capacitor electrically connected between the RF input terminal and the RF cold point node.

In accordance with another aspect of the embodiment, the impedance matching network may include a bypass resistor electrically connected in parallel across the second capacitor between the RF input terminal and the RF cold point node, and a third capacitor electrically connected between the second inductance and the first ground reference node.

In accordance with an embodiment, a packaged RF amplifier device may include a transistor, a first lead, and an integrated device electrically coupled between the first lead and the transistor. The integrated device may include a portion of an impedance matching circuit that includes a RF cold point node, and a first baseband decoupling circuit that is coupled to the RF cold point node of the impedance matching circuit. The packaged RF amplifier device may further include a second lead that is coupled to the RF cold point node.

In accordance with another aspect of the embodiment, the first baseband decoupling circuit may include a first resistance, a first inductance, and a first capacitor. The packaged RF amplifier device may further include a first ground terminal. The first resistance, the first inductance, and the first capacitor may be coupled in series between the RF cold point node and the first ground terminal. The first baseband decoupling circuit may be configured to pass signal energy at baseband frequencies to the first ground terminal.

In accordance with another aspect of the embodiment, the second lead may form a portion of a second baseband decoupling circuit that includes the second lead, a second resistance, a second inductance, and a second capacitor that are coupled in series between the RF cold point node and a second ground terminal that is external to the packaged RF amplifier device.

In accordance with another aspect of the embodiment, the impedance matching network may include a first capacitor coupled between the RF cold point node and a ground terminal, a first inductance coupled between the RF cold point node and the transistor, a second inductance coupled between the ground terminal and the first lead, and a second capacitor coupled between the first lead and the RF cold point node.

In accordance with another aspect of the embodiment, the integrated device may include a semiconductor substrate. The transistor may include a high electron mobility transistor.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A device comprising:
   an amplifier having a control terminal;
   an input terminal;
   a first ground terminal;
   an impedance matching network electrically connected between the control terminal of the amplifier and the input terminal, wherein the impedance matching network comprises a radio frequency (RF) cold point node that provides a low impedance path to the first ground terminal for signals within a predetermined frequency range, and wherein the impedance matching network includes a circuit selected from a band-pass matching network and a low-pass matching network;
   a first baseband decoupling circuit electrically connected between the RF cold point node and the first ground terminal; and
   a second baseband decoupling circuit that is coupled in parallel with the first baseband decoupling circuit, wherein the second baseband decoupling circuit is electrically connected to the RF cold point node.

2. The device of claim 1, wherein the first baseband decoupling circuit comprises a first resistance, a first inductor, and a first capacitor that are electrically connected in series between the RF cold point node and the first ground terminal, and wherein the first baseband decoupling circuit is a low impedance path to the first ground terminal for baseband frequency signals that oscillate at baseband frequencies.

3. The device of claim 2, wherein the second baseband decoupling circuit comprises a second resistance, a second inductor, and a second capacitor that are electrically connected in series between the RF cold point node and a second ground terminal.

4. The device of claim 1, wherein the impedance matching network further comprises:
   a first capacitor electrically connected between the RF cold point node and the first ground terminal; and
   a first inductance electrically connected between the RF cold point node and the control terminal of the amplifier.

5. The device of claim 4, wherein the impedance matching network further comprises:
   a second inductance electrically connected between the input terminal and the RF cold point node; and
   a second capacitor electrically connected between the first ground terminal and the input terminal.

6. The device of claim 4, wherein the impedance matching network further comprises:
   a second inductance electrically connected between the first ground terminal and the input terminal; and
   a second capacitor electrically connected between the input terminal and the RF cold point node.

7. The device of claim 6, wherein the impedance matching network further comprises:
   a bypass resistor electrically connected in parallel with the second capacitor between the input terminal and the RF cold point node; and
   a third capacitor electrically connected between the second inductance and the first ground terminal.

8. The device of claim 1, wherein the amplifier comprises a high electron mobility transistor formed on a semiconductor substrate.

9. A system comprising:
   a packaged electronic device comprising:
      a transistor having a control terminal,
      a radio frequency (RF) input terminal,
      a first ground reference node,
      an impedance matching network electrically connected between the control terminal of the transistor and the RF input terminal, wherein the impedance matching network comprises a RF cold point node that presents a low impedance path to the first ground reference node for signals within a predetermined frequency range, and
      a first baseband decoupling circuit electrically connected between the RF cold point node and the first ground reference node, wherein the first baseband decoupling circuit includes a first resistance, a first inductance, and a first capacitor that are electrically connected in series between the RF cold point node and the first ground reference node; and
   a second baseband decoupling circuit having a portion that is external to the packaged electronic device and that is electrically connected between the RF cold point node and a second ground reference node.

10. The system of claim 9, wherein the second baseband decoupling circuit includes a second resistance, a second inductance, and a second capacitor, that are electrically connected in series between the RF cold point node and the second ground reference node.

11. The system of claim 10, wherein the second inductance includes a plurality of bond wires and a package lead, wherein the second resistance includes a surface mount resistor, and wherein the second capacitor includes a surface mount capacitor.

12. The system of claim 9, wherein the impedance matching network further comprises:
    a first capacitor electrically connected between the RF cold point node and the first ground reference node; and
    a first inductance electrically connected between the RF cold point node and the control terminal of the transistor.

13. The system of claim 12, wherein the impedance matching network further comprises:
    a second inductance electrically connected between the first ground reference node and the RF input terminal; and
    a second capacitor electrically connected between the RF input terminal and the RF cold point node.

14. The system of claim 13, wherein the impedance matching network further comprises:
    a bypass resistor electrically connected in parallel across the second capacitor between the RF input terminal and the RF cold point node; and
    a third capacitor electrically connected between the second inductance and the first ground reference node.

15. A packaged radio frequency (RF) amplifier device comprising:
    a transistor;
    a first lead;
    an integrated device electrically coupled between the first lead and the transistor, the integrated device comprising:
       a portion of an impedance matching circuit that comprises a RF cold point node, and
       a first baseband decoupling circuit that is coupled to the RF cold point node of the impedance matching circuit, wherein the first baseband decoupling circuit includes a first resistance, a first inductance, and a first capacitor;
    a second lead that is coupled to the RF cold point node; and a first ground terminal, wherein the first resistance, the first inductance, and the first capacitor are coupled in series between the RF cold point node and the first ground terminal, and wherein the first baseband decoupling circuit is configured to pass signal energy at baseband frequencies to the first ground terminal.

16. The packaged RF amplifier device of claim 15, wherein the second lead forms a portion of a second baseband decoupling circuit that includes the second lead, a second resistance, a second inductance, and a second capacitor that are coupled in series between the RF cold point node and a second ground terminal that is external to the packaged RF amplifier device.

17. The packaged RF amplifier device of claim 15, wherein the impedance matching network comprises:
   a first capacitor coupled between the RF cold point node and a ground terminal;
   a first inductance coupled between the RF cold point node and the transistor;
   a second inductance coupled between the ground terminal and the first lead; and
   a second capacitor coupled between the first lead and the RF cold point node.

18. The packaged RF amplifier device of claim 15, wherein the integrated device includes a semiconductor substrate, and wherein the transistor includes a high electron mobility transistor.

\* \* \* \* \*